(12) United States Patent
Walther et al.

(10) Patent No.: US 10,634,572 B2
(45) Date of Patent: Apr. 28, 2020

(54) AUTOMATIC BONDING FORCE CALIBRATION

(71) Applicant: Hesse GmbH, Paderborn (DE)

(72) Inventors: Frank Walther, Paderborn (DE); Hans-Juergen Hesse, Paderborn (DE); Andreas Jochheim, Paderborn (DE)

(73) Assignee: Hesse GmbH, Paderborn (DE)

( * ) Notice: Subject to any disclaimer, the term of this patent is extended or adjusted under 35 U.S.C. 154(b) by 173 days.

(21) Appl. No.: 15/736,419

(22) PCT Filed: Jun. 14, 2016

(86) PCT No.: PCT/DE2016/100271
§ 371 (c)(1),
(2) Date: Dec. 14, 2017

(87) PCT Pub. No.: WO2016/202327
PCT Pub. Date: Dec. 22, 2016

(65) Prior Publication Data
US 2018/0113046 A1    Apr. 26, 2018

(30) Foreign Application Priority Data

Jun. 15, 2015  (DE) .................. 10 2015 109 485
Jun. 8, 2016  (DE) .................. 10 2016 110 590

(51) Int. Cl.
| | | |
|---|---|---|
| *G01L 25/00* | (2006.01) |
| *B23K 3/08* | (2006.01) |
| *B23K 20/26* | (2006.01) |
| *H01L 23/00* | (2006.01) |
| *B23K 20/00* | (2006.01) |

(52) U.S. Cl.
CPC ............ *G01L 25/00* (2013.01); *B23K 3/08* (2013.01); *B23K 20/26* (2013.01); *H01L 24/78* (2013.01); *B23K 20/004* (2013.01); *H01L 2224/78001* (2013.01); *H01L 2224/783* (2013.01)

(58) Field of Classification Search
CPC ............... G01L 25/00; H01L 24/78; H01L 2224/78001; B23K 3/08; B23K 20/26
See application file for complete search history.

(56) References Cited

U.S. PATENT DOCUMENTS

| 6,119,917 A | 9/2000 | Takahashi |
| 2013/0305804 A1* | 11/2013 | Burchard ............ B81C 99/0045 |
| | | 73/1.01 |

OTHER PUBLICATIONS

International Preliminary Report on Patentability (with English language translation) dated Dec. 28, 2017, in International Application No. PCT/DE2016/100271.
International Search Report dated Oct. 18, 2016, in International Application No. PCT/DE2016/100271.

* cited by examiner

*Primary Examiner* — David Z Huang
(74) *Attorney, Agent, or Firm* — Patent Central LLC; Stephan A. Pendorf

(57) ABSTRACT

A calibration method for a bonder. Characteristics of a force actuator of the bonder are measured and stored in such a way that the force actuator can be controlled optimally during production operation of the bonder on the basis of the measured data. Further, a device for fully automatic or partially automatic bonding force calibration.

14 Claims, 6 Drawing Sheets

Figure 1:
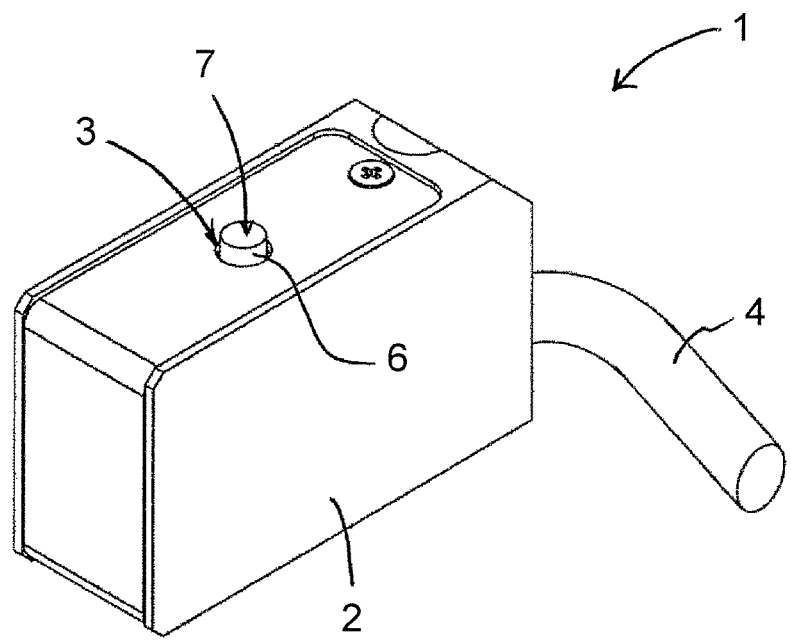

| | | | | | | | | | Current | | | | | | | | |
|---|---|---|---|---|---|---|---|---|---|---|---|---|---|---|---|---|---|
| | | I1 | I2 | I3 | I4 | I5 | I6 | I7 | I8 | I9 | I10 | I11 | I12 | I13 | I14 | F$_{Spring}$(z) |
| Deflection | z1 | F1-1 | F2-1 | F3-1 | F4-1 | F5-1 | F6-1 | F7-1 | F8-1 | F9-1 | F10-1 | F11-2 | F12-1 | F13-1 | F14-1 | F$_{Spring}$1 |
| | z2 | F1-2 | F2-2 | F3-2 | F4-2 | F5-2 | F6-2 | F7-2 | F8-2 | F9-2 | F10-2 | F11-3 | F12-2 | F13-2 | F14-2 | F$_{Spring}$2 |
| | z3 | F1-3 | F2-3 | F3-3 | F4-3 | F5-3 | F6-3 | F7-3 | F8-3 | F9-3 | F10-3 | F11-4 | F12-3 | F13-3 | F14-3 | F$_{Spring}$3 |
| | z4 | F1-4 | F2-4 | F3-4 | F4-4 | F5-4 | F6-4 | F7-4 | F8-4 | F9-4 | F10-4 | F11-5 | F12-4 | F13-4 | F14-4 | F$_{Spring}$4 |
| | z5 | F1-5 | F2-5 | F3-5 | F4-5 | F5-5 | F6-5 | F7-5 | F8-5 | F9-5 | F10-5 | F11-6 | F12-5 | F13-5 | F14-5 | F$_{Spring}$5 |
| | z6 | F1-6 | F2-6 | F3-6 | F4-6 | F5-6 | F6-6 | F7-6 | F8-6 | F9-6 | F10-6 | F11-7 | F12-6 | F13-6 | F14-6 | F$_{Spring}$6 |
| | z7 | F1-7 | F2-7 | F3-7 | F4-7 | F5-7 | F6-7 | F7-7 | F8-7 | F9-7 | F10-7 | F11-8 | F12-7 | F13-7 | F14-7 | F$_{Spring}$7 |
| | z8 | F1-8 | F2-8 | F3-8 | F4-8 | F5-8 | F6-8 | F7-8 | F8-8 | F9-8 | F10-8 | F11-9 | F12-8 | F13-8 | F14-8 | F$_{Spring}$8 |
| | z9 | F1-9 | F2-9 | F3-9 | F4-9 | F5-9 | F6-9 | F7-9 | F8-9 | F9-9 | F10-9 | F11-10 | F12-9 | F13-9 | F14-9 | F$_{Spring}$9 |
| | z10 | F1-10 | F2-10 | F3-10 | F4-10 | F5-10 | F6-10 | F7-10 | F8-10 | F9-10 | F10-10 | F11-11 | F12-10 | F13-10 | F14-10 | F$_{Spring}$10 |
| | z11 | F1-11 | F2-11 | F3-11 | F4-11 | F5-11 | F6-11 | F7-11 | F8-11 | F9-11 | F10-11 | F11-12 | F12-11 | F13-11 | F14-11 | F$_{Spring}$11 |
| | z12 | F1-12 | F2-12 | F3-12 | F4-12 | F5-12 | F6-12 | F7-12 | F8-12 | F9-12 | F10-12 | F11-13 | F12-12 | F13-12 | F14-12 | F$_{Spring}$12 |
| | z13 | F1-13 | F2-13 | F3-13 | F4-13 | F5-13 | F6-13 | F7-13 | F8-13 | F9-13 | F10-13 | F11-14 | F12-13 | F13-13 | F14-13 | F$_{Spring}$13 |
| | z14 | F1-14 | F2-14 | F3-14 | F4-14 | F5-14 | F6-14 | F7-14 | F8-14 | F9-14 | F10-14 | F11-15 | F12-14 | F13-14 | F14-14 | F$_{Spring}$14 |

Fig. 4

| Deflection | | m(z) | F_Spring(z) |
|---|---|---|---|
| | $z_1$ | $m_1$ | $F_{Spring}1$ |
| | $z_2$ | $m_2$ | $F_{Spring}2$ |
| | $z_3$ | $m_3$ | $F_{Spring}3$ |
| | $z_4$ | $m_4$ | $F_{Spring}4$ |
| | $z_5$ | $m_5$ | $F_{Spring}5$ |
| | $z_6$ | $m_6$ | $F_{Spring}6$ |
| | $z_7$ | $m_7$ | $F_{Spring}7$ |
| | $z_8$ | $m_8$ | $F_{Spring}8$ |
| | $z_9$ | $m_9$ | $F_{Spring}9$ |
| | $z_{10}$ | $m_{10}$ | $F_{Spring}10$ |
| | $z_{11}$ | $m_{11}$ | $F_{Spring}11$ |
| | $z_{12}$ | $m_{12}$ | $F_{Spring}12$ |
| | $z_{13}$ | $m_{13}$ | $F_{Spring}13$ |
| | $z_{14}$ | $m_{14}$ | $F_{Spring}14$ |

Fig. 5

AUTOMATIC BONDING FORCE CALIBRATION

The invention relates to a calibration method for a bonder, in which a characteristic for a force actuator of the bonder is measured and stored, so that the force actuator can be optimally controlled during production operation of the bonder on the basis of the data acquired by measurement. Furthermore, the invention relates to a device for fully automatic or partially automatic bond force calibration.

In industrial practice, semiconductor devices are connected to a carrier substrate by electrically conducting wires that are welded to the carrier substrate by thermal compression, thermosonic or ultrasound (TC, TS or US bonding). During the bonding or welding process, the electrically conductive wires are pressed with a defined force profile onto a contact point (bonding pad) of the substrate. In order to ensure this, in a bonding head of the bonder, besides a spring a force actuator is provided for holding a bonding tool. The bonding force acting on the bonding tool then corresponds to the sum of the spring force and the force effect of the force actuator (actuator force). During bonding, the wire is deformed so that the position of the bonding tool changes during the bonding process. Regardless of the position of the bonding tool, however, the bonding force must continue to follow the defined, time-dependent force profile. For this purpose, the force actuator must be suitably controlled during bonding.

While generally the spring force is a function of (spring-) deflection, the actuator force is a function of the applied current and the deflection. The bonding force must be applied with an accuracy of approximately 1 cN for thin-wire bonders and approximately 5 cN for thick-wire bonders (wire diameter>100 mm). The precise knowledge about the relationships between the bonding force and the deflection and the current on the one hand and the robustness and accuracy of the associated calibration routine for the force actuator on the other is decisive for achieving the accuracy.

When using normal spiral springs for holding the bonding tool, there is a linear relationship between the deflection and the spring force. The actuator force of a voice coil actuator is linearly correlated to the current, but is not independent of the location. The non-linearity due to the location dependence is now usually compensated by the measurements of current, deflection and bond force in three calibration points and the calculation of a suitable polynomial. The measurement values are determined using a measuring device for determining the bonding force, in particular a scale, in a specific operating mode (calibration mode or method) of the bonder provided for this purpose, interactively involving the machine operator. For measurement the calibration points to be viewed must be set stably, i.e., the axes must not move during the measurement and input interval, and the current of the force actuator must be constant. The user ascertains the force value for the bonding force by reading an optical display of the force measuring device and inputs these via input means, the a controller of the bonder adopts the force value and, after acknowledging the input, also stores the current position value which corresponds to a specific deflection of the spring, as well as the current applied into the force actuator. The deflection and the current are stored together with the force value.

Between the reading of the measuring value and the input to the controller by the user, a greater period of up to several seconds passes, which results in the case of a non-constant position of the bonding tool results in that the controller does not store the correct values of electric current, deflection and bonding force. This inaccuracy has an influence on the accuracy of the bonding process and the quality of the bonder product.

Up to now, aluminum wires have been processed in thick-wire bonders in which pressing forces of a maximum of 200 cN are required. In modern plants, copper wires are increasingly used for contact-making, since they have many advantages over aluminum wires with respect to their current carrying capacity, durability and temperature stability. However, the required forces during bonding using copper wires of the same diameter have increased to up to 5,000 cN. The force actuators used for applying these bonding forces are regularly no longer linear. The performance curve must be taken into consideration insofar as a function of the location or the deflection. Furthermore, during the deflection of the bonding tools which are mounted in bending joints, the bonding forces are no longer linearly dependent on the deflection. However, a calibration of the force actuator with regard to the force acting on the welding point must also be carried out with the same precision. This may require the detection of significantly more measured values in correspondingly more calibration points so that the application of the previous manual calibration method takes considerably longer due to the requirement to carry out the measurement statically. In the case of strong non-linearity, even small fluctuations can alter the measured values to an unacceptable degree.

A further problem results from the fact that, particularly in modern double head bonding machines, the available space does not allow a stable positioning of an external force measuring device, in particular a scale. This measuring device is currently temporarily provided in a bonding area of the bonder during the duration of the calibration process.

The object of the present invention is to provide an improved calibration method for a bonder and a bonder designed for carrying out the method.

To achieve the object, the invention has the features of patent claim 1. In this respect, the inventive calibration method for a bonder a bonding head, wherein a bonding tool provided as part of the bonding head is held by a spring and a force actuator, with a current sensor for detecting a current used for driving the force actuator, with a position sensor for detecting a deflection of a spring, with a controller and with a measuring device for determining a bonding force, includes the following method steps:

- in a positioning step, the bonding head is positioned in a working area of the bonder in such a way that the bonding tool is provided above a measurement technically effective contact surface of an actuating element of the measuring device,
- in a contact step, the bonding head is lowered and the bonding tool is located on the contact surface of the measuring device;
- in a measurement step a first pressure force is impressed upon the measurement technically effective contact area of the measuring device, then at the same time or with a delay in an at least quasi-static operating state of the bonder the bonding force is detected by the measuring device, the deflection of the spring is detected by means of the position sensor and the current is detected by means of the current sensor, and from the deflection, a spring characteristic curve of the spring and the bonding force an actuator force and/or a spring force are determined;
- the measuring values for the deflection and the current on the one hand, as well as the bonding force and/or the spring force and/or the actuator force on the other hand, are fed to a memory assigned to the controller and stored there;

the measuring step and the storage step are performed again for at least a second pressure force.

According to the invention, the values for the bonding force determined by means of the measuring device, the values for the deflection of the spring determined by means of the position sensor and the current determined by the current sensor are detected automatically for the force actuator and without manual input for example involving the machine operator are data-technically supplied to the controller and stored. The method for calibrating the force actuator therefore dispenses with the manual work steps which are customary today. In particular, the force measure value does not have to be read by the machine operator and fed manually via input means to the control means. The calibration procedure can thus be carried out more quickly, which results in significant advantages over the manual method with respect to the measurement accuracy. In particular, an inadmissibly large position change during the measuring process, which falsifies the measuring values, is counteracted by the automation of the method. Furthermore, an error input by the machine operator is effectively prevented.

In the context of the invention, the working area of the bonder is the area in which the bonding head can be moved or positioned. A bond region of the bonder is the partial region of the working area in which the semiconductor components can be bonded to the carrier substrate during the production operation. It is in this respect that the working area is normally larger than the bonding area. In addition, the nomenclature is selected in such a way that a pressure force is first abstractly applied to the measuring device by means of the bonding tool. This pressure force is referred to as a bonding force after its numerical detection by the measuring device. An at least quasi-static operating condition in the sense of the invention is achieved when the operating parameters of the bonder with respect to the pressure force or the bonding force, the current and the deflection of the spring during the duration of the measured value detection are not subject to any fluctuations or, at any rate, to impermissibly high fluctuations, which could lead to a falsification of the measuring result to the extent that the measured values determined within the scope of the calibration method are not suitable for controlling the force actuator during production operation because the predetermined force profiles can not be set sufficiently accurately and the required bond quality is not achieved.

For example, the measuring step and the memory step according to the invention can be executed sequentially. The measurement step is then carried out first, and after the determination of all measured values the measured values are stored in the memory in the subsequent memory step. Optionally, the measured values are postprocessed before being stored in the controller. Alternatively, it can be provided that the measuring step and the storage step for the same pressure force are carried out overlapping in time. For example, first measured values are determined, which are then stored in the memory, while at the same time further measured values are determined, which are subsequently stored. In this respect, it is not provided in this case that initially all measured values are determined and these measured values are subsequently stored.

The bond force determined by measurement is defined as the sum of the actuator force and the spring force. In this case, it is possible to determine the spring force from the bonding force via the measurement-determined deflection and the known spring characteristic curve of the spring, and finally the actuator force from the difference between the bonding force and the spring force.

According to the method according to the invention, provision can be made to deposit the bonding force and the actuator force and the spring force for the various calibration points. It can also be provided that only the bonding force or only the actuator force is stored, since the respective non-stored force values can be calculated by suitable algorithms from the bonding force or from the actuator force. It is also possible to store the bonding force and the spring force or the bonding force and the actuator force or the actuator force and the spring force.

According to a preferred embodiment of the invention, the bonding head is positioned outside the bonding area of the bonder in the positioning step. Correspondingly, the measuring device is provided in the working area of the bonder and also outside the bonding area of the bonder. Advantageously, this makes it possible to construct the measuring device as a permanently installed part of the bonder, which remains permanently in the bonder and is not temporarily positioned during the calibration of the force actuator in the bonding area of the bonder and has to be removed after carrying out the calibration process. The positioning of the bonding head or measuring device in the working area of the bonder and outside the bonding area of the bonder permits the measuring device to be permanently connected to the control system of the bonder via a data line since the bonding area is unchanged and unrestricted for receiving the carrier substrate and carrying out the bonding process during the bonding production operation. Likewise, a permanent energy supply of the measuring device on the bonder can be realized.

According to a further development of the invention, at least four and preferably ten or more different deflections are run per applied current for the force actuator and the bonding forces for the different deflections are determined by means of the measuring device. Advantageously, by recording four or more different deflections for a same current, a very precise performance map for the force actuator can be determined with respect to the different deflections. As a consequence, force actuators can be very accurately and sensitively be controlled with respect to deflection even when the deflection is a non-linear characteristic in response to a constant current, so that the force curve created during the bonding operation corresponds to the specifications and the bond quality is increased.

According to a further development of the invention, for each deflection at least four and preferably ten or more different currents are applied for the force actuator, and the bonding forces for the different currents are determined by means of the measuring device. Advantageously, the characteristic of the force actuator can beneficially be determined very precisely by the determination of at least four different currents per deflection. As a result, relying on the characteristic of the force actuator, the force curve can be precisely devised during the production operation. This results in a significant improvement in the bond quality, in particular for force actuators having a non-linear characteristic with respect to the current.

According to the invention, it can also be provided that the characteristic of the force actuator is determined in the manner of a performance map for different deflections and different currents. It is thereby regularly necessary to run a large number of calibration points and to detect a plurality of measured values. The measuring points can be determined quickly and reliably, that is, in particular, in the required accuracy and free from input errors, owing to the automation of the method and the omission of the manual input of the force values by the machine operator.

According to a further development of the invention, an actuation force which counteracts the spring force can be imparted during the carrying out of the calibration method by trading the bonding tool with a pulling tool with a hook and hooking the hook of the pulling tool into an eyelet provided on the actuating element of the measuring device. A defined deflection can then be set in this way, and the current for the actuator can be so applied that the spring force of the actuator force is counteracted. Advantageously, the performance map for a bi-directionally acting force actuator, that is to say a force actuator configured for the application of pressure forces and tensile forces, can be determined by means of the calibration method according to the invention. During the production operation, it is then possible to reduce the force exerted by the deflection of the spring at a predetermined tool position.

According to a further development of the invention, a first force increase value and a second force increase value are formed as a quotient of the actuator force and the current for a given current of the force actuator as well as for a first deflection and at least one second deflection. By the determination of the force-increasing value dependent on the deflection, the bonding force during the operating process can be determined in a particularly simple manner in the event that the force increases linearly with the current during a given deflection. In particular, the bonding force can be determined as the product of the spring force which is dependent on the deflection and the product of the force increase value which is also dependent on the deflection and the current. In the case of force actuators whose actuator force is linearly dependent on the current for a given deflection, the determination of the force increase value results in a particularly simple and rapid calibration and a simple control in the production operation.

To achieve the object, the invention features the characteristics of patent claim 9. There is provided a bonding device for the fully automatic or semi-automatic bonding force calibration of a bonder having a bonding head, wherein a bonding tool intended as part of the bonding head is held by a spring and a force actuator, including load cell as a measuring device (1) for determining a bonding force mounted in a work area (10) of the bonder and outside of a bonding area (11) of the bonder, wherein the load cell can be acted on with a pressure force, preferably with a pressure force and a tensile force, by a bonding tool provided on the bonding head of the bonder as force applying component, wherein the load cell is data linked to a controller of the bonder in such a way that measured values of the load cell are transmitted to the controller of the bonder and there are further processed and/or stored, including a position sensor data-technically connected to the controller for detecting a deflection of the spring, including a sensor data-technically connected to the controller for sensing a current of the force actuator and including a memory formed as part of the controller for storing the measured values of the load cell and/or the position sensor and/or the current sensor and/or an actuator force determined from the measurement of bond force and the deflection of the spring, and/or a spring force.

Advantageously, the device according to the invention provides the possibility of performing the calibration operation of the force actuator fully automatically or semi-automatically. In particular, a three-part value signal comprising the bonding force, the deflection and the current can be determined simultaneously or within a very short time interval, with the result that the characteristic of the force actuator can be determined with very high accuracy and as a consequence the bonding process can be optimized. With the fully automatic calibration of the force actuator, it can be provided in particular that a calibration routine is started and a complete performance map determination is carried out without further manual interventions in which different deflections for the spring are run and/or currents are impressed for the force actuator and the bonding force is determined. As a part of the fully automated calibration, the positioning step can be carried out, for example, by moving the measuring device to a known position of the working area which is correlated to the position in of the bonder and then lowering the bonding head in the direction of the measuring device. In the case of the semi-automatic bond force calibration it can be provided that a first calibration point is set and a three-part value of bonding force, current and deflection is automatically detected for the first calibration point without manual intervention by the machine operator and that a manual input or confirmation of the operator is then necessary in order after the first measurement and memory step to set a second calibration point and repeat the measurement value determination.

According to a further development of the invention, a measuring device with a bending beam which can be deformed under the compressive force is provided as a force measuring sensor. Advantageously, the provision of the bending beam allows the load cell to be designed in a particularly robust and long-lasting manner in a structurally simple manner and at the same time to determine the values for the bonding force sufficiently precisely. For example, strain gauges can be used to determine the force, or a deflection of the bending beam can be detected optically.

According to a further development of the invention, the load cell has an actuating element with a contact surface. The pressure force is applied to the load cell via the contact surface by means of the bonding tool. In addition, an eyelet may be provided to apply a tensile force to the load cell. In order to apply the tensile force, the bonding tool can be exchanged for a pulling tool, wherein the pulling tool has a hook which can be inserted into the eyelet.

Further advantages, features and details of the invention can be gathered from the further subclaims and the following description. Characteristics mentioned there can each be individually relevant to the invention, or in any desired combination. Characteristics and details of the device described according to the invention are, of course, also related to the method according to the invention and vice versa. Thus, the disclosure to the individual aspects of the invention can always be referred to as reciprocal.

The drawings are provided by way of example only and are not intended to be limiting.

Figure 2:
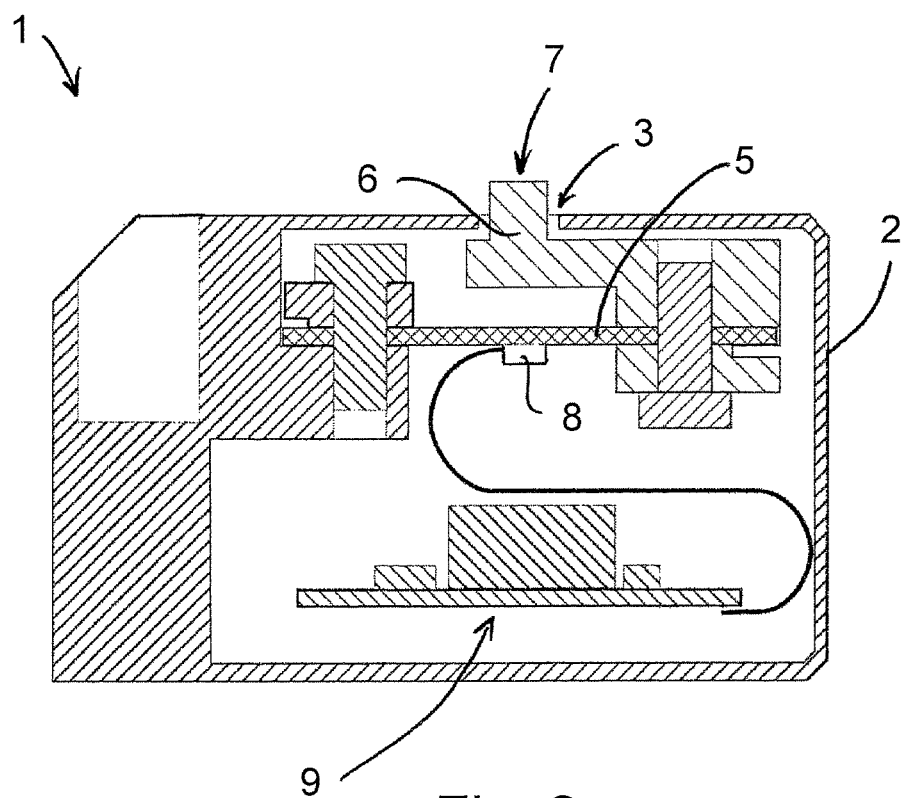
Figure 3:
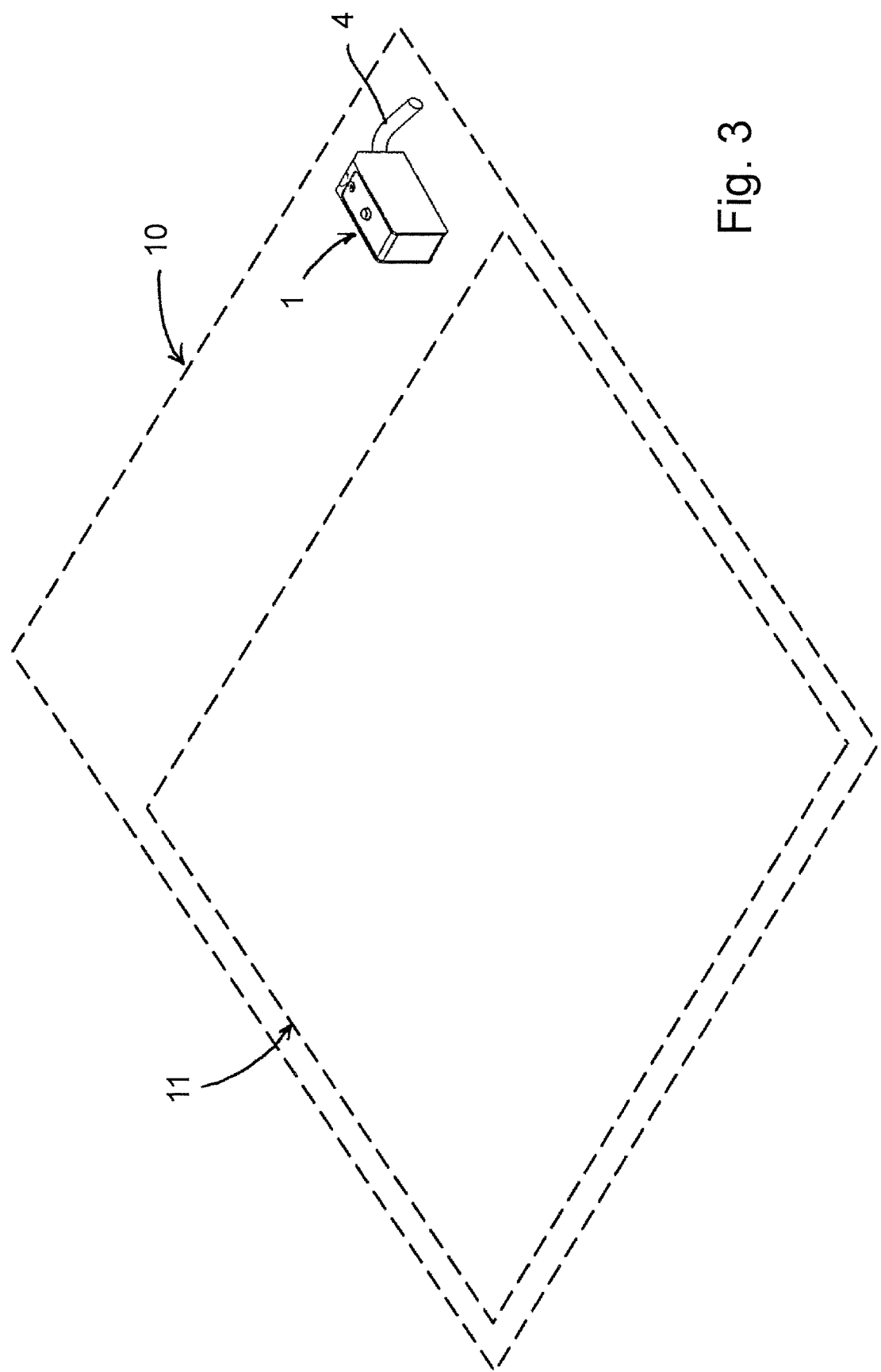
Figure 6:
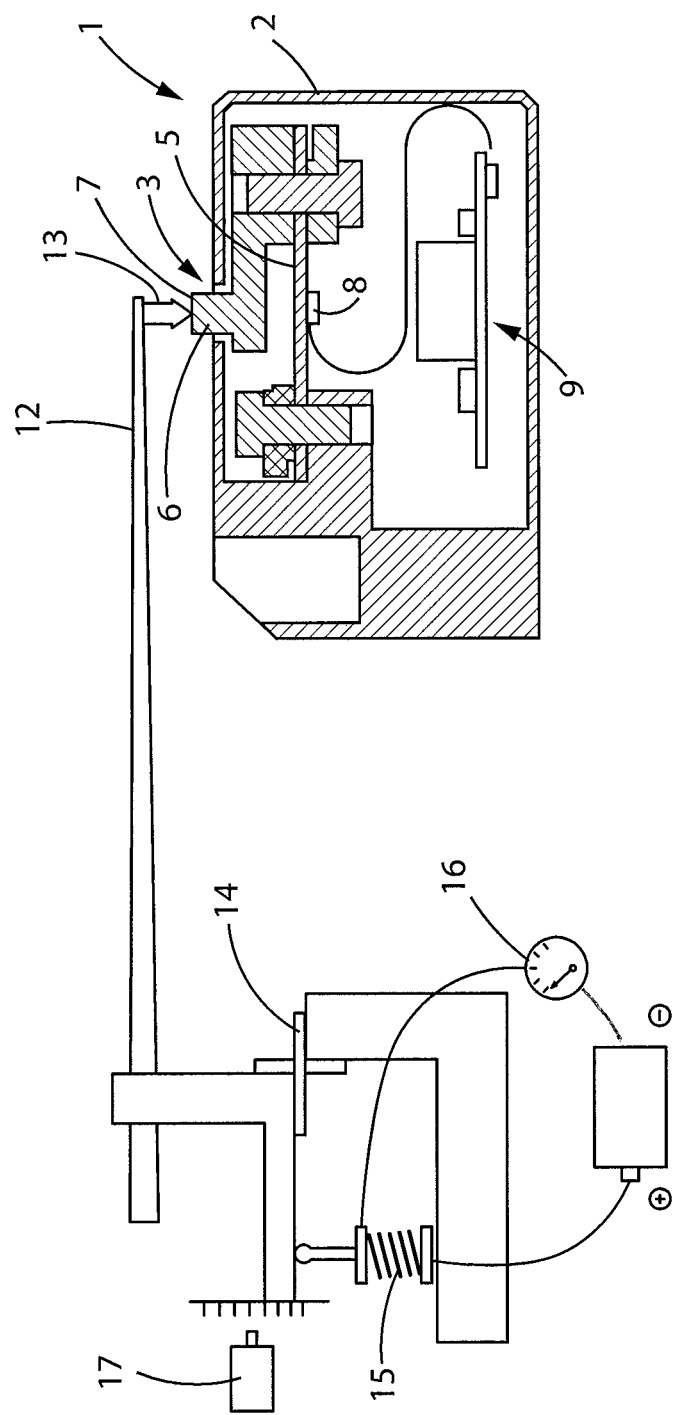
Figure 7:
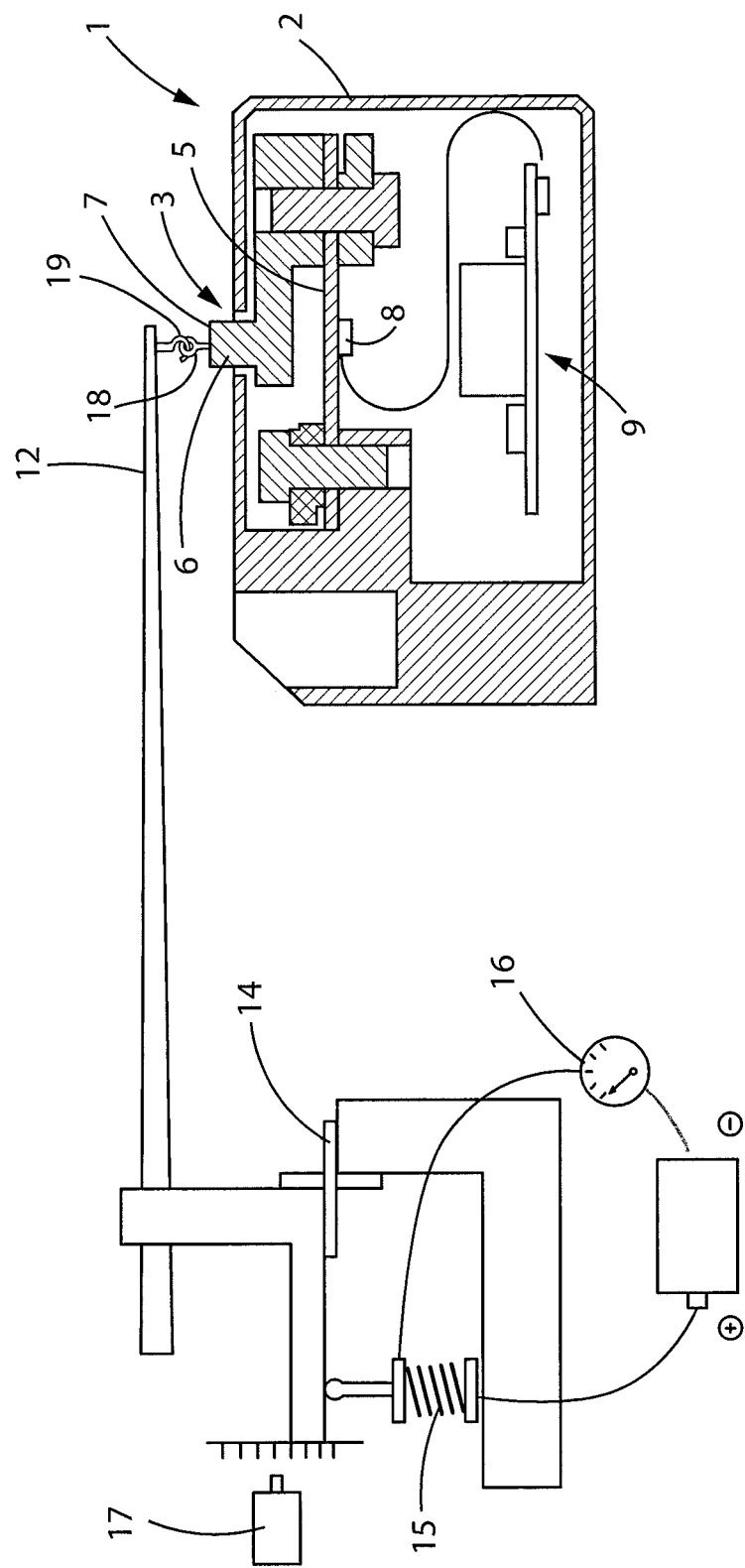

There is shown in:

FIG. 1 a perspective view of a measuring device for determining a bonding force of a bonder, FIG. 2 a basic internal construction of the measuring device according to FIG. 1, FIG. 3 an arrangement of the measuring device according to FIG. 1 in a working area of the bonder, FIG. 4 a first performance map determined during the course of calibration with an inventive calibration process for an actuator force and a spring force, FIG. 5 another performance map determined with the inventive calibration map for calibration of the bonder, FIG. 6 shows a measuring device next to a wire bonding apparatus, and FIG. 7 shows an embodiment of the invention for applying a nulling force rather than a pressing force.

A measuring device 1 according to FIGS. 1 and 2 used for determining a bonding force is provided with a housing 2 with a opening 3 and a connecting line 4. The connecting line 4 serves on the one hand for the supply of energy to the measuring device 1 and on the other hand for the data-technical connection to the measuring device 1 to a controller of a bonder. In particular, the power supply to the measuring device 1 can be effected directly by the bonder.

The measuring device 1 has as a measuring-technically effective component a bending beam 5 clamped on one side, on which an actuating element 6 is fixed. A segment of the actuating element 6 projects out of the housing 2 through the opening 3 of the measuring device 1. The actuating element 6 has, outside the housing 2, a substantially flat contact surface 7 to which a bonding tool, not shown, of the bonder is attached for imposing a pressing force. The bonding tool is realized as part of a bonding head of the bonder and is held in a corresponding receptacle of the bonding head.

A measured value pickup sensor 8, in particular a strain measuring strip, is fixed to the bending beam 5 of the measuring device 1. The measured value pickup sensor 8 is connected via a flexible conductor to electronics 9 of the measuring device 1. In this respect, a pressing force (bonding force) can be detected by an actuation of the measuring device 1, that is to say the occurrence of a pressure force on the contact surface 7 via a deflection of the bending beam 5.

Optionally, provision can be made for an eyelet 18 to be provided on the actuating element 6. The eyelet is preferably provided in the region of the contact surface 7 or instead of the contact surface 7. By means of the provision of the eye, the eye can be gripped with a hook 19 of the pulling tool instead of the bonding tool when a pulling tool is used. In this respect, it is possible, in addition to a spring force, to apply a pulling force component by means of a force actuator which is counteracted by the spring force and/or is detected by the measuring device 1.

FIG. 3 shows the arrangement of the measuring device 1 in a working area 10 of the bonder. The working area of the bonder is characterized in that the bonding head of the bonder, which has the force actuator, can be freely positioned therein. The arrangement of the measuring device 1 in the working area 10 of the bonder is in this case selected such that the measuring device 1 is provided outside a bonding area 11. The bonding area 11 is the partial region of the working area 10 of the bonder, in which the semiconductor components are bonded to the carrier substrate during production operation.

The arrangement of the measuring device 1 outside the bonding area 11 ensures that the measuring device 1 can be fixedly arranged and permanently installed without restricting the usability of the bonder during production operation. For example, it can be provided that, outside the bonding area, the positioning of the bonding head is performed with an accuracy which is not sufficient for the bonding but nevertheless ensures that the bonding tool is positioned with sufficient accuracy above the contact surface 7 of the measuring device 1.

The implementation of the inventive calibration method for the bonder is firstly discussed below with reference to a first performance map according to FIG. 4 and the bonding device as shown in FIG. 6. In this case, the bonding head 12 with bonding tool 13 is positioned in a positioning step above the measurement technical effective contact surface 7 of the measuring device 1. In a contact step, the bonding head is lowered against the force of spring 14 and deposited on the contact surface 7. Subsequently, in a measuring step, a first compressive force, not initially measured with respect to amount, is impressed on the measuring device 1, wherein then simultaneously or with time delay in a quasi-static operating state of the bonder by means of the measuring device 1 the bond force and by means of a position sensor 17 of the bonder a layout of a spring 14 implemented as a part of the bonding head and for holding the bonding tool, and by means of a current sensor 16 of the bonder a current is sensed which is supplied to the force actuator 15 of the bonder. The bonding tool 13 is held by the spring 14 and by the force actuator 15. The bonding force is a function of the sum of the actuator force of the force actuator and the spring force. In a memory step, the measured values for the layout and the current, on the one hand, and the bonding force or the spring force or the actuator force, on the other hand, are fed to a memory allocated to the controller of the bonder and stored there. Finally, the measuring step and the storage step are carried out for a plurality of further calibration points. In this respect, the deflection and/or the current can be varied.

For the various calibration points, the corresponding bond force values are stored in the performance map according to FIG. 4. It is in this respect that, by way of example, fourteen values for the electrical current and fourteen values for the deflection of the spring are detected and stored in a matrix together with the spring force. The spring force is determined, in the case of a known spring characteristic curve, from the deflection detected by means of the position sensor.

Since, as a result of the determination of the performance map during the calibration, the characteristic of the force actuator is known, the operating parameters for the bonder required for achieving a required, defined force profile while bonding during production operation can now be calculated from the calibration data. If the force effect of the force actuator is independent of the direction of the electric current, the forces for the entire process area can be calculated directly from the calibration data determined for positive currents. A positive current here corresponds to an actuator pressure force and a negative current to an actuator pull force.

According to an alternative embodiment of the calibration method, separate bonding forces can be determined for positive currents and negative currents. This is particularly necessary if the force actuator does not provide the same opposing force for positive currents of a given current amplitude as negative currents of the same current amplitude. In this case, the bonding tool usually has to be replaced with a pulling tool. The hook is then provided on the pulling tool which is inserted in an eyelet provided on the actuating element of the measuring device 1 for applying tensile force components provided by the force actuator.

According to a further alternative embodiment of the calibration method, in the event that the measured values determined with respect to the current, the deflection or the bonding force are dependent on the preceding process conditions (hysteresis), the precursor values are stored in addition to the current measured values. Depending on the previous history, the determination of the bonding forces is possible, with the result that the defined force profiles can be set during the production operation, taking into account the previous history.

According to a further alternative embodiment of the calibration method, in the event that an influence of the temperature on the measured values has to be taken into account in order to achieve the required accuracy, the performance maps are expanded by the dimension of the temperature. The temperature is then stored along for various and preferably for all measured values or three-part values as current, deflection and bond force. The temperature can be determined, for example directly via additionally attached sensors or indirectly determined from a thermodynamic model or estimated.

Alternatively a simplified embodiment of the calibration method can be used, if for a given deflection the actuator force increases linearly with the current. First, in this case, as described in FIG. 5, for selected calibration points, the actuator force by application of current is shown as a function of the current. A change of the bonding head in the individual calibration points produces the slope of a straight equation, wherein a force increase value m dependent on the deflection is determined as the quotient of the actuator force and the current. The bond force during operation can then be determined as the sum of the actuator force and the spring force from the equation $$F_{Bond}(z) = m(z) \cdot i + F_{spring}(z),$$

where z is to be understood as referring to the deflection and i as the applied current.

The invention claimed is:

1. A calibration method for a bonder with a bonding head, wherein a bonding tool provided as part of the bonding head is held by a spring and a force actuator, with a current sensor for detecting a current used for driving the force actuator, with a position sensor for detecting a deflection of the spring, with a controller and with a measuring device for determining a bonding force, the method including the following method steps:
in a positioning step, positioning the bonding head in a working area of the bonder and outside a bonding area of the bonder, wherein the bonding area is a partial region of the working area of the bonder in which semiconductor components are bonded to a carrier substrate during a production operation, in such a way that the bonding tool is provided above a measurement technically effective contact surface of an actuating element of the measuring device,
in a contact step, lowering the bonding head and locating the bonding tool on the contact surface of the measuring device;
in a measurement step, impressing a first pressure force upon the measurement technically effective contact surface of the measuring device, then, at the same time or with a delay, in an at least quasi-static operating state of the bonder, detecting the bonding force via the measuring device, detecting the deflection of the spring via the position sensor and detecting the current via the current sensor, and from the deflection, determining a spring characteristic curve of the spring and the bonding force of an actuator force and/or a spring force;
in a storage step, feeding the detected values for the deflection and the current on the one hand, as well as the bonding force and/or the spring force and/or the actuator force on the other hand, to a memory assigned to the controller and storing there;
performing the measuring step and the storage step again for at least a second pressure force.

2. The calibration method according to claim 1, wherein at least four different deflections are run, each at a different current, and the bonding forces for the various deflections are determined by means of the measuring device.

3. The calibration method according to claim 1, wherein at least four different currents are applied for the force actuator and bonding strengths are determined for the different currents via the measuring device.

4. The calibration, method according to claim 1, wherein the actuator force and/or the bonding force and/or the spring force is/are stored in the memory of the controller via a current and deflection performance map.

5. The calibration method according to claim 1, wherein for a given current of the force actuator and for a first and at least a second deflection, a first and a second force gain value (m) is formed as a quotient of the actuator force and the current.

6. The calibration method according to claim 5, wherein for the first deflection and for the at least a second deflection, the spring forces are determined and stored.

7. The calibration method according to claim 1, wherein for each current ten or more different deflections are run and the bonding forces for the various deflections are determined by means of the measuring device.

8. The calibration method according to claim 1, wherein for each deflection ten or more different currents are applied for the force actuator and the bonding strengths are determined for the different currents via the measuring device.

9. The calibration method according to claim 1, wherein the measuring device is a permanently installed part of the bonder.

10. A calibration method for a bonder with a bonding head, wherein a bonding tool provided as part of the bonding head is held by a spring and a force actuator, with a current sensor for detecting a current used for driving the force actuator, with a position sensor for detecting a deflection of the spring, with a controller and with a measuring device for determining a bonding force, the method including the following method steps:
in a positioning step, positioning the bonding head in a working area of the bonder and outside a bonding area of the bonder, wherein the bonding area is a partial region of the working area of the bonder in which semiconductor components are bonded to a carrier substrate during a production operation, in such a way that the bonding tool is provided above a measurement technically effective contact surface of an actuating element of the measuring device,
in a contact step, lowering the bonding head and locating the bonding tool on the contact surface of the measuring device;
in a measurement step, impressing a first pressure force upon the measurement technically effective contact surface of the measuring device, then, at the same time or with a delay, in an at least quasi-static operating state of the bonder, detecting the bonding force via the measuring device, detecting the deflection of the spring via the position sensor and detecting the current via the current sensor, and from the deflection, determining a spring characteristic curve of the spring and the bonding force of an actuator force and/or a spring force;
in a storage step, feeding the detected values for the deflection and the current on the one hand, as well as the bonding force and/or the spring force and/or the actuator force on the other hand, to a memory assigned to the controller and storing there;
performing the measuring step and the storage step again for at least a second pressure force,
wherein for imparting an actuator force counteracting the spring force, the bonding tool is replaced with a pulling tool with a hook and the hook is hooked in an eyelet provided on the actuating element (6) of the measuring device, and then the deflection and the current are applied such that the spring force counteracts the actuator force.

11. A device for the fully automatic or semi-automatic bonding force calibration of a bonder having a bonding head, wherein a bonding tool intended as part of the bonding head is held by a spring and a force actuator, comprising a load cell as a measuring device (1) for determining a bonding force mounted in a work area (10) of the bonder and outside a bonding area (11) of the bonder, wherein the bonding area is a partial region of the work area of the bonder in which semiconductor components are bonded to a carrier substrate during a production operation, wherein the load cell is acted on with a pressure force by the bonding tool provided on the bonding head of the bonder as a force applying component, wherein the load cell is data linked to a controller of the bonder in such a way that measured values of the load cell are transmitted to the controller of the bonder and further processed and/or stored, a position sensor data-technically connected to the controller for detecting a deflection of the spring, a current sensor data-technically connected to the controller for sensing a current of the force actuator and a memory formed as part of the controller for storing the measured values of the load cell and/or the position sensor and/or the current sensor.

12. The device according to claim 11, wherein the load cell includes a bending beam (5) deformable by the bonding force.

13. The device according to claim 11, wherein the load cell has an actuating element (6) having a contact surface (7) for imparting the pressing force and/or an eye for introducing a tensile force.

14. The device according to claim 11, wherein the load cell is acted on with a pressure force and a tensile force by the bonding tool provided on the bonding head of the bonder as the force applying component.

* * * * *